US006831482B2

(12) United States Patent
Cunningham et al.

(10) Patent No.: US 6,831,482 B2
(45) Date of Patent: Dec. 14, 2004

(54) CONTROL OF GUARD-FLOPS (75) Inventors: Paul Alexander Cunningham, Milton (GB); Stephen Paul Wilcox, Cambridge (GB)

(73) Assignee: Azuro (UK) Limited, Cambridge (GB)

( * ) Notice: Subject to any disclaimer, the term of this patent is extended or adjusted under 35 U.S.C. 154(b) by 34 days.

(21) Appl. No.: 10/434,092

(22) Filed: May 9, 2003

(65) Prior Publication Data

US 2004/0004504 A1 Jan. 8, 2004

(30) Foreign Application Priority Data

May 9, 2002 (GB) .............................................. 0210625

(51) Int. Cl.[7] .............................................. H03K 19/00
(52) U.S. Cl. .............................. 326/93; 326/46; 326/94; 326/95
(58) Field of Search ............................. 326/46, 93, 94, 326/95

(56) References Cited

U.S. PATENT DOCUMENTS

| | | | | |
|---|---|---|---|---|
| 6,166,564 | A | * 12/2000 | Rosen ......................... | 326/93 |
| 6,225,827 | B1 | * 5/2001 | Fujii et al. .................... | 326/93 |
| 6,323,688 | B1 | * 11/2001 | Podlesny et al. ............. | 326/93 |
| 6,420,905 | B1 | * 7/2002 | Davis et al. .................. | 326/96 |
| 6,559,681 | B1 | * 5/2003 | Wu et al. ..................... | 326/93 |
| 6,768,342 | B2 | * 7/2004 | Greenstreet et al. .......... | 326/93 |

OTHER PUBLICATIONS

Benini L. Micheli G.D. "Synthesis of Low–Power Selectively–clocked Systems from High–Level Specification" *ACM Transactions on Design Automation of Electronic Systems*, vol. 5, No. 3, Jul. 2000, 311–321.

Benini et al., "Symbolic synthesis of Clock–Gating Logic for Power Optimization of Synchronous Controllers" Association for Computing Machinery, Inc., Paper #L249, (C) 1998, 2000.

Raghavan et al. "Automatic Insertion of Gated Clocks at Register Transfer Level" Proceedings of the Twelfth International Conference on VLSI Design, 1999, 48–54.

*Guarded Evaluation: Pushing Power Management to Logic Synthesis/Design*, V. Tiwari, S. Malik, P. Ashar, IEEE Transactions on Computer–Aided Design of Integrated Circuits and Systems, vol. 17 iss 10, Oct 1998.

*Automating RT–Level Operand Isolation to Minimize Power Consumption in Datapaths*, M. Munch, B. Wurth, R. Mehra, J. Sproch, N. When, Proceedings of the Design Automation and Test in Europe conference (DATE 2000), Mar. 2000.

* cited by examiner

*Primary Examiner*—Michael Tokar
*Assistant Examiner*—Lam T. Mai
(74) *Attorney, Agent, or Firm*—Finnegan, Henderson, Farabow, Garrett & Dunner, LLP (57) ABSTRACT A latch is provided which includes: a transparent catch latch having a data input, a data output and a control node arranged to receive a catch signal; a transparent pass latch having a data input connected to the data output of the transparent catch latch at an internal storage node, a data output, and a control node arranged to receive a pass signal; and logic circuitry having an enable input and a clock input connected to provide a gated clock signal to provide one of said catch signal and said pass signal.

In another aspect an integrated circuit is provided with input and output guard flops, each including a transparent catch latch and a transparent pass latch, and further including a logic gate with an enable input and a clock input connected to provide a gated clock signal to at least one of the transparent pass latch of the input guard-flop and transparent catch latch of the output guard flop.

13 Claims, 12 Drawing Sheets

Creating catch and pass signals for guard-flops

Fig. 1 Storage element holding old data

Fig. 2 Conventional clock-gating scheme

Fig. 3 Insertion of guarding logic

Fig. 4 Two-phase clocking scheme

Fig. 5 Single-phase clocking scheme

Fig. 6
First three elements in the guard-flop family

Fig. 7 Two-phases of guard-flop control

Fig. 10
Creating catch and pass signals for guard-flops

Fig. 11 Translation Rule 1

Fig. 12 Translation Rule 2

Fig. 13a Rule 3a: Create pass group

Fig. 12a

Fig. 13b Rule 3b: Pass on demand

Fig. 13c Rule 3: Create early signal

CONTROL OF GUARD-FLOPS

RELATED CASES

This application claims priority to Great Britain Application No. 0210625.0 filed May 9. 2002.

1. Field of the Invention

This invention relates to an integrated circuit constructed of guard-flops and to a guard-flop itself.

2. Background of the Invention

Most digital integrated circuits today are fabricated using a CMOS process. One of the reasons that CMOS has become prevalent is because it dissipates less power than competing technologies, but now as chip speeds rise, even CMOS chips consume too much power.

Clock gating is a well-known technique in conventional synchronous CMOS circuits.

Figure 1:
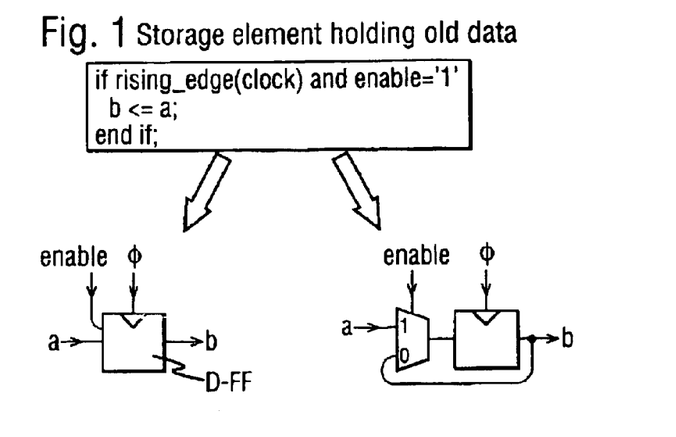
FIG. 1 shows two versions of a D-type flip-flop holding old data.

A clock is a global signal, distributed to all storage elements which are conventionally implemented as D-type flip-flops. In conventional circuits without clock gating, storage elements that do not need to capture new data are either disabled explicitly or a multiplexor is used to feed the current output of the storage element back to the input. These two options are shown in FIG. 1. FIG. 1 also illustrates terminology which will be mentioned here because it is used in the following. Letter a denotes a data input to the D-type flip-flop D-FF, where as b denotes the data output. Input data a is supplied to an input data terminal and the output data b is taken from an output data terminal. An enable signal is supplied to an enable input of the D-type flip-flop, and a clock signal $\phi$ is supplied to the clock terminal. The diagram on the right hand side of FIG. 1 shows a multiplexer M receiving the input data a and the output data b and being controlled by the enable signal.

Figure 2:
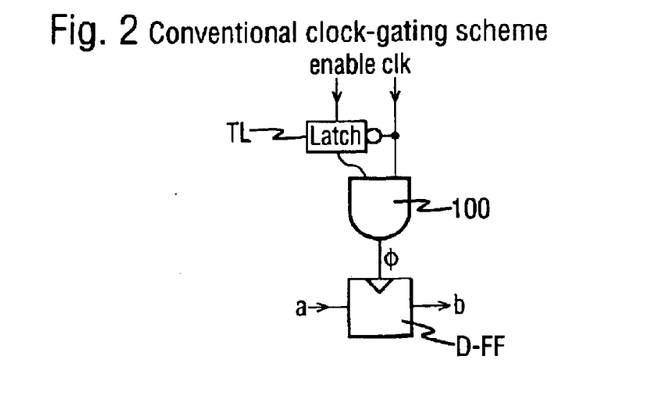
FIG. 2 shows a conventional clock gating scheme.

Applying a clock input to a flip-flop that does not change its output is a waste of power, so schemes have been developed that avoid useless clocking. One such scheme is shown in FIG. 2. An AND gate 100 only applies the clock $\phi$ when the flip-flop D-FF is enabled, and a transparent TL latch is used to make sure that glitches on the enable wire carrying the enable signal do not cause unintentional clock pulses on the clock input to the flip-flop.

This scheme has been proposed in various academic papers, such as:

*Automatic Insertion of Gated Clocks at Register Transfer Level*, N. Raghavan, V. Akella and S. Bakshi, Proceedings of the Twelfth International Conference on VLSI Design, 1999, pp 48–54

*Symbolic Synthesis of Clock-Gating Logic for Power Optimization of Synchronous Controllers*, L, Benini, G. De Micheli, E. Macii, M. Poncino, R. Scarsi, ACM Transactions on Design Automation of Electronic Systems, vol 4 no 4, October 1999

*Synthesis of Low-Power Selectively-Clocked Systems from High-Level Specification*, L. Benini and G. De Micheli, ACM Transactions on Design Automation of Electronic Systems, vol 5 no 3, July 2000

Figure 3:
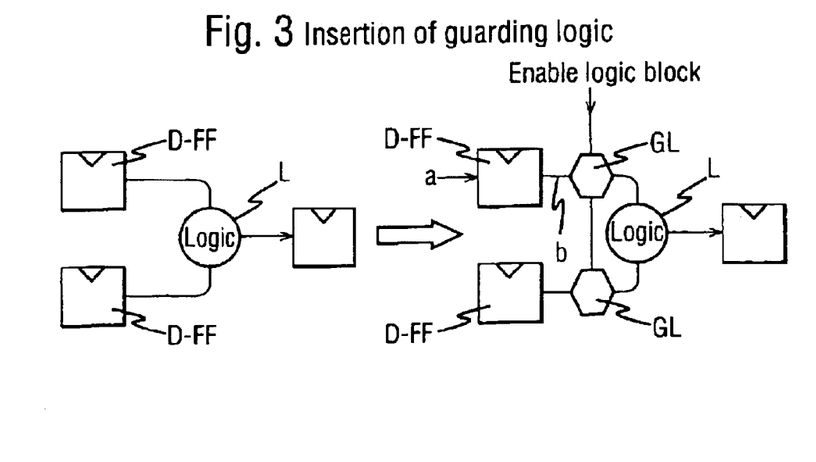
FIG. 3 shows insertion of guarding logic into a circuit including D-type flip-flops.

Another power saving technique is referred to herein as "guarding". Logic blocks in CMOS circuits only consume appreciable power when their inputs change. It is possible to reduce the power taken by the whole circuit if the inputs to small portions of the circuit are only permitted to change when the outputs of that small portion are needed. FIG. 3 shows the basic idea.

The output of the logic block L may not always be clocked into the flip-flop. If the inputs to the logic change when the output is not required, energy will be needlessly consumed inside the logic block.

Guarding solves this problem by placed additional guarding logic GL in the form of additional gates between the inputs of the logic block L and the registers (D-flip flops) that supply their output data b to those inputs, as shown on the right of FIG. 3. These additional gates block any inputs to the logic L that do not produce a useful output, but the inputs are delayed by passing through the additional logic, and this can affect the speed of the circuit. Techniques for low-power design need to avoid slowing down the logic, because speed is almost always important. If speed is not important, it is easier to trade speed for power by simply lowering the supply voltage $V_{dd}$.

The additional gates GL inserted for guarding can be either simple gates (AND or OR) or transparent latches, but there advantages and disadvantages associated with each:

AND and OR gates have a small additional delay, and can often be absorbed into the logic block at the technology mapping stage. Unfortunately, they do not block input transitions, but simply force the output to one rail or the other—this can often lead to more input changes than without the guarding logic, which then outweighs the power saving.

Transparent latches block input changes effectively, but they have significant propagation delay, and this is likely to slow down the circuit.

Guarding using AND gates and OR gates is an established technique. Guarding using transparent latches is mentioned in the following two papers.

*Guarded Evaluation: Pushing Power Management to Logic Synthesis/Design*, V. Tiwari, S. Malik, P. Ashar, IEEE Transactions on Computer-Aided Design of Integrated Circuits and Systems, Vol 17 iss 10, October 1998

*Automating RT-Level Operand Isolation to Minimize Power Consumption in Datapaths*, M. Munch, B. Wurth, R. Mehra, J. Sproch, N. When, Proceedings of the Design Automation and Test in Europe conference (DATE 2000), March 2000.

In the early days of synchronous circuits, two-phase clocking schemes were used [*Introduction to VLSI Systems*, C. Mead and L. Conway, Addison Wesley 1980].

Figure 4:
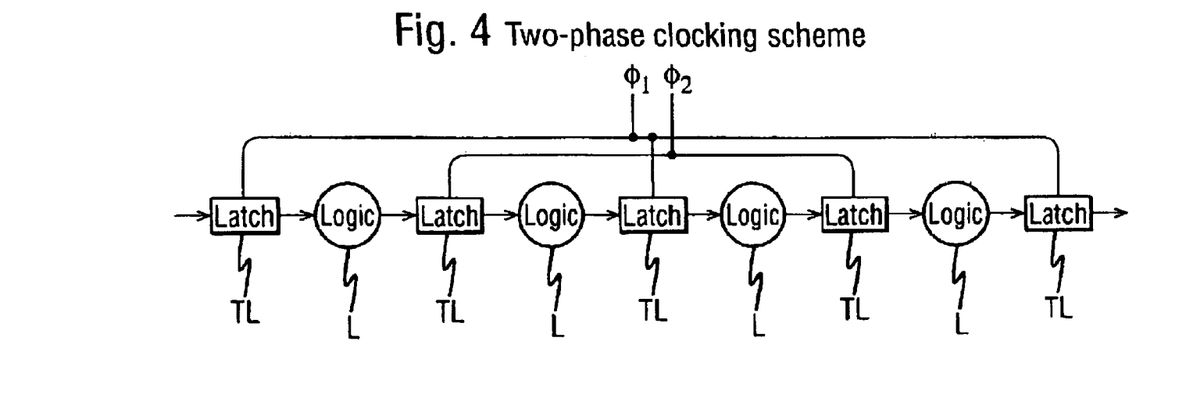
FIG. 4 illustrates a two-phase clocking scheme for transparent latches.

The storage elements used were transparent latches TL, with alternate latch banks clocked off opposite phases of the clock. A complete cycle of the circuit consists of a rising edge on $\phi_1$, a falling edge on $\phi_1$, a rising edge on $\phi_2$ and then a falling edge on $\phi_2$. The two-phase clocking scheme is shown in FIG. 4.

Figure 5:
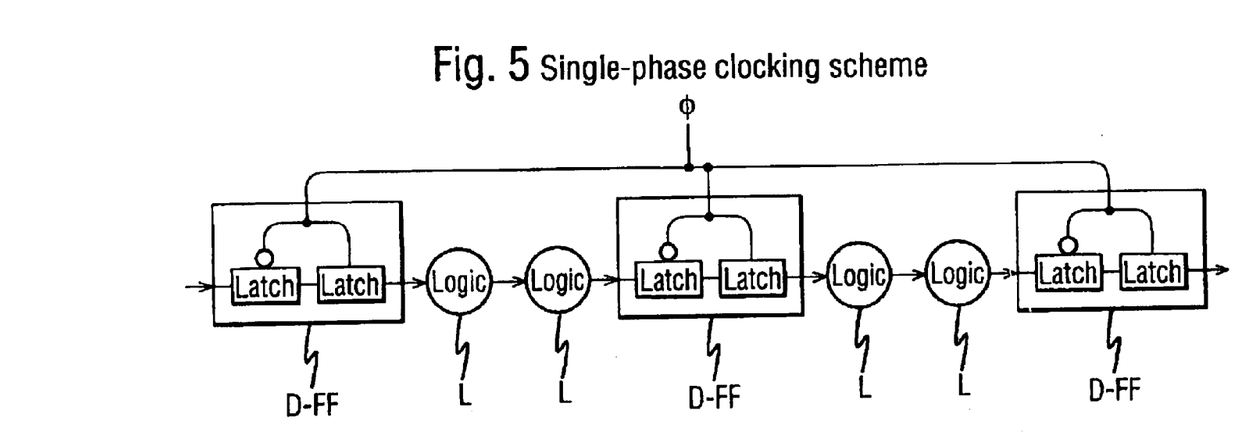
FIG. 5 shows a single phase clocking scheme for a circuit involving D-type flip-flops.

As clock speeds rose, it became more difficult to distribute a pair of high-speed clocks with the correct timing relationships, so single-phase clocking started to dominate. Today, single-phase clocking is universally employed. Single-phase design still uses two latches per stage, as shown in FIG. 5, but the latches are combined into a single storage element, known as a D-type flip-flop. It is to be noted that in the present description $\phi$ is used to denote a clock input which provides both phases and which is conventionally referred to in the art as clk.

The D-type is considered to be a single state-holding element comprising two transparent latches, with the state held at the output of the right-hand transparent latch. In a clock-gated chip using D-types, the left-hand latch is only used to stop shoot-through, and there is no useful state held on the internal node of the D-type.

SUMMARY OF THE INVENTION

It is an aim of the present invention to provide an integrated circuit which functions as an equivalent circuit to one using D-type flip-flops but which consumes less power than the original circuit, yet runs at the same clock rate.

According to one aspect of the present invention there is provided a latch circuit comprising: a transparent catch latch having a data input, a data output and a control node arranged to receive a catch signal, a transparent pass latch having a data input connected to the data output of the transparent catch latch at an internal storage node, a data output, and a control node arranged to receive a pass signal; and logic circuitry having an enable input and a clock input connected to provide a gated clock signal to provide one of said catch signal and said pass signal.

Another aspect of the invention provides an integrated circuit comprising an input guard-flop, combinational logic and an output guard-flop, wherein each guard-flop comprises a transparent catch latch connected to a data input and arranged to hold data on an internal storage node of the guard-flop, a transparent pass latch connected to the internal storage node and arranged to pass data to a data output node, and wherein the data output node of the input guard-flop is connected to the input of the combinational logic and the data input node of the output guard-flop is connected to the output of the combinational logic, the integrated circuit further comprising a logic gate having an enable input and a clock input connected to provide a gated clock signal to at least one of the transparent pass latch of the input guard-flop and the transparent catch latch of the output guard-flop.

In the integrated circuit and latch circuit defined above, each of the transparent catch latch and transparent pass latch is individually controlled, preferably via respective gated clocks. By independently controlling the latches and then clock gating the independent control signals, significant power savings can be produced. This is a key innovative step in guard-flop design and its control.

BRIEF DESCRIPTION OF THE DRAWINGS

For a better understanding of the present invention and to show how the same may be carried into effect reference will now be made by way of example to the accompanying drawings in which:

FIGS. 6a, b and c illustrate respectively each of three elements in a guard-flop family;

FIG. 14b is a timing diagram for the circuit of FIG. 14a;

DETAILED DESCRIPTION

In order to understand the present invention, an understanding of guard-flops is needed, as provided in the following description.

Figures 6, 6A, 6B, 6C:
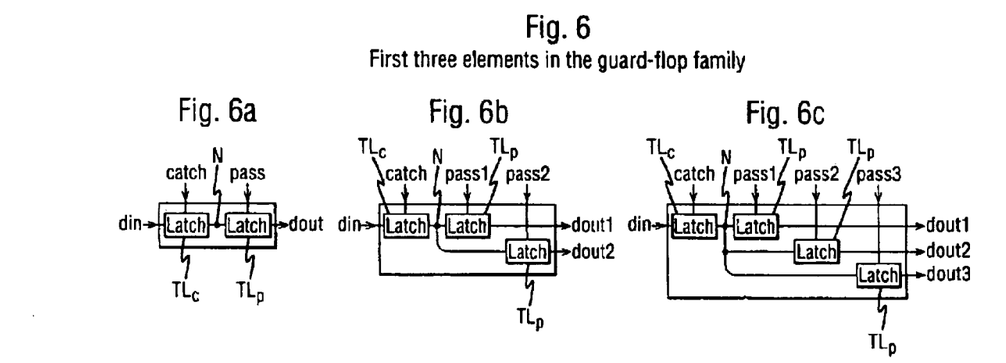

Guard-flops are a family of state-holding elements built from transparent latches. For each natural number k=1, 2, . . . , there is a guard-flop with k data outputs and one data input. The first three are shown in FIGS. 6a, 6b and 6c. Each guard-flop has a transparent catch latch $TL_c$ and one or more transparent pass latch $TL_p$.

Guard-flops differ from D-types because the state is held on the internal node N. A guard-flop creates a controlled region in the middle—data can be captured from the data input node $d_{in}$ by bringing a catch signal high, and data can be passed to other places in the circuit from the output node $d_{out}$ by bringing one of the pass signals high.

Guard-flops are not new per se and are structurally very similar to D-type flip-flops—the one-output guard flop is identical to a D-type apart from a single inverter. Their construction is well known to a skilled person and so is not described further herein.

However, guard-flops differ from D-type flip-flops in an important respect. Guard-flops have two sets of control inputs: a catch input and one or more pass inputs. In the techniques and circuits described herein, these inputs are controlled independently to give the full benefits of guard-flops.

Figure 7:
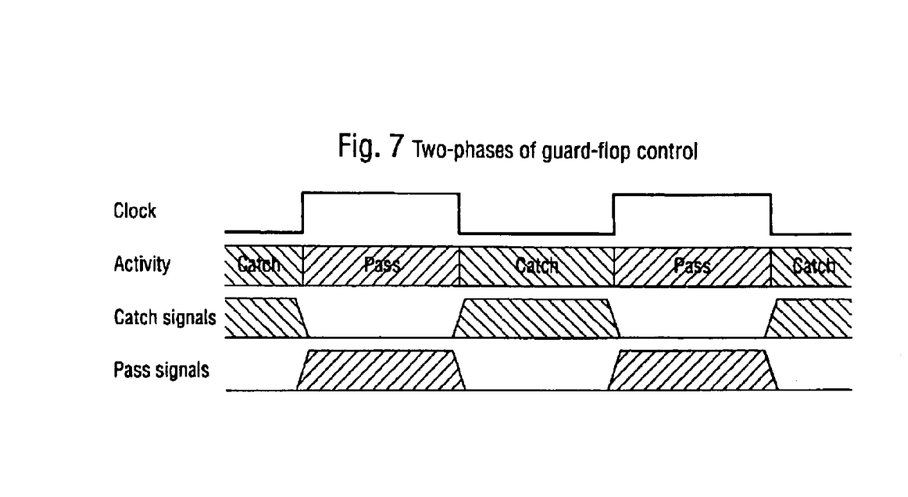
FIG. 7 illustrates two phases of guard-flop control.

The catch and pass latches $TL_c$, $TL_p$ of a guard-flop are enabled in turn, with overlaps between them of less than one latch delay. This is shown in FIG. 7.

Figure 8A:
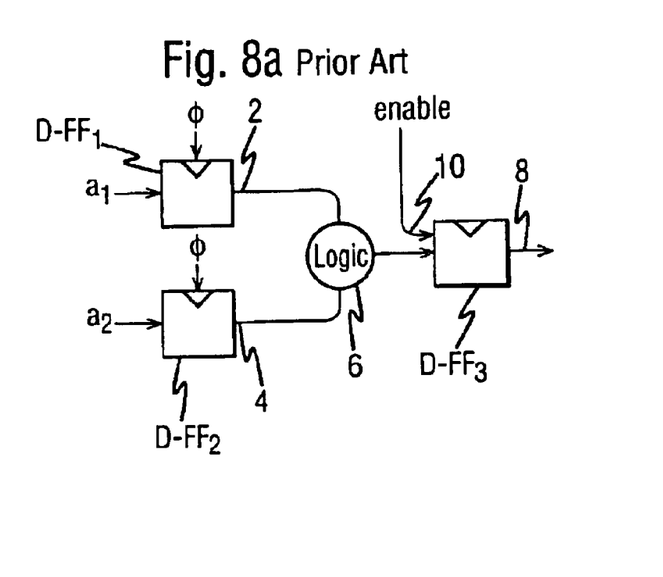
FIG. 8a is a schematic circuit diagram of a circuit involving D-type flip-flops and FIG. 8b is the converted version of that circuit in guard-flops.
Figure 8B:
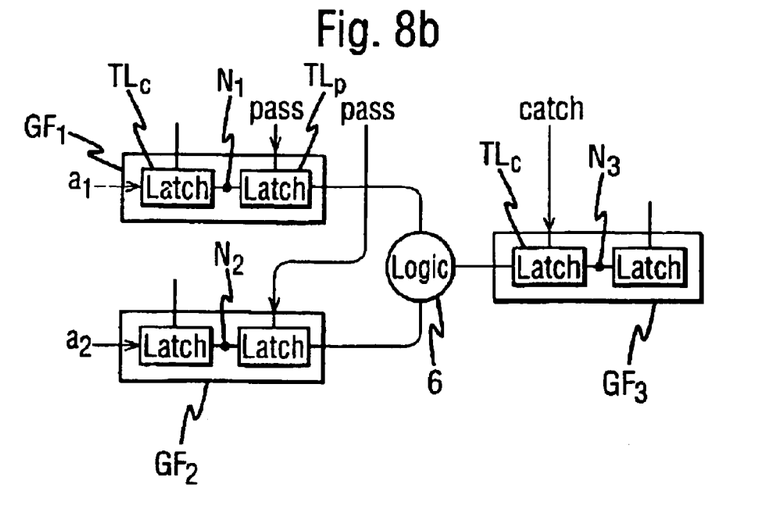

FIGS. 8a and 8b illustrate the comparison between data flow through a D-type flip-flop (FIG. 8a) and data flow through a guard-flop (FIG. 8b). FIG. 8a shows two input D-type flip-flops $D-FF_1$, $D-FF_2$ each having a data output node labelled 2, 4 connected to a logic circuit 6. The output of the logic circuit is connected to an output D-type flip-flop $D-FF_3$ having an output node 8 and an enable input 10 for receiving an enable signal. The enable input to the D-type flip-flop $D-FF_3$ allows that flip-flop to be disabled when it does not need to catch new data.

FIG. 8b shows the "equivalent" guard-flop structure. There are two input guard-flops $GF_1$, $GF_2$ connected as inputs to the logic circuit 6. The output of the logic circuit 6 is connected to an Output guard-flop $GF_3$. Each guard-flop GF has an internal node N on which state is stored. This is denoted by the dotted arrows in FIG. 8b. As already mentioned, each guard-flop comprises a transparent catch latch $TL_c$ and a transparent pass latch $TL_p$. On the input guard-flops the important control element is the pass signal supplied to the transparent pass latch in each case. For the output guard-flop $GF_3$ the important signal is the catch signal supplied to the transparent catch latch $TL_c$ of the guard-flop.

Note that although in FIG. 8a the input clock signals $\phi$ to the D-type flip-flops are illustrated, the clock signals themselves are not illustrated in FIG. 8b. In fact, the catch and pass signals are generated from the clock signals in a manner to be described in more detail herein.

Figure 9:
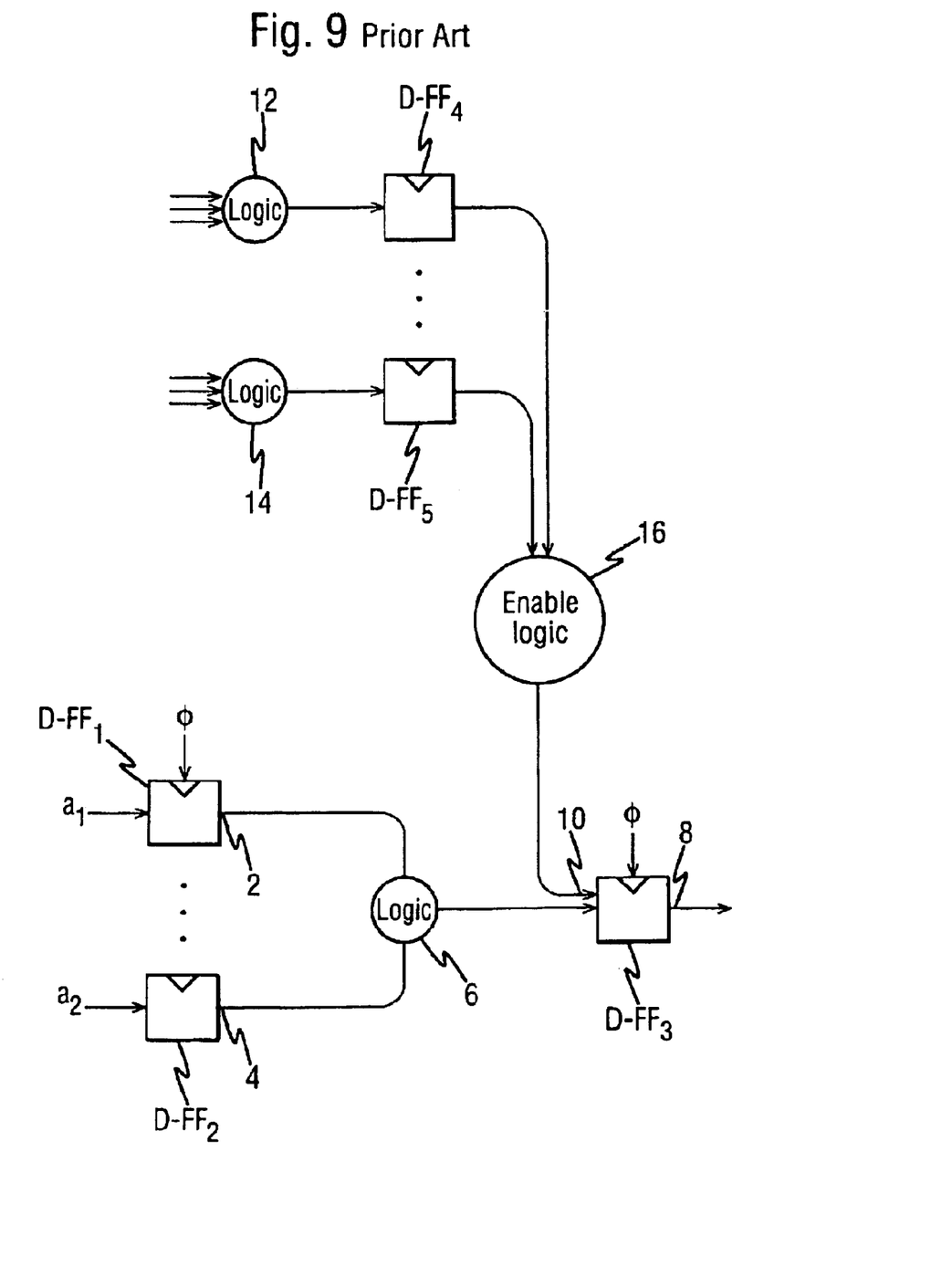
FIG. 9 is a circuit involving D-type flip-flops illustrating generation of an enable signal.

There follows a discussion of how to generate the catch and pass signals, without an end user of the "equivalent" circuit being aware that this is happening. The generation of the enable signal for a conventional D-type can be drawn as in FIG. 9. FIG. 9 shows the data handling flip-flops D-FF$_1$, D-FF$_2$, D-FF$_3$ as illustrated in FIG. 8a. A further set of D-type flip-flops D-FF$_4$ . . . D-FF$_5$ are shown in FIG. 9 which act as control flip-flops for generating the enable signal supplied to the enable input 10 of the output D-type flip-flop D-FF$_3$. The inputs to these control D-type flip-flops are ,supplied from respective logic circuits 12, 14 and their outputs are supplied to enable logic 16 which determines the state of the enable signal. In contrast, in order to control the guard-flop scheme illustrated in FIG. 8b, catch and pass signals need to be generated based on the movement of data through the circuit.

Figure 10:
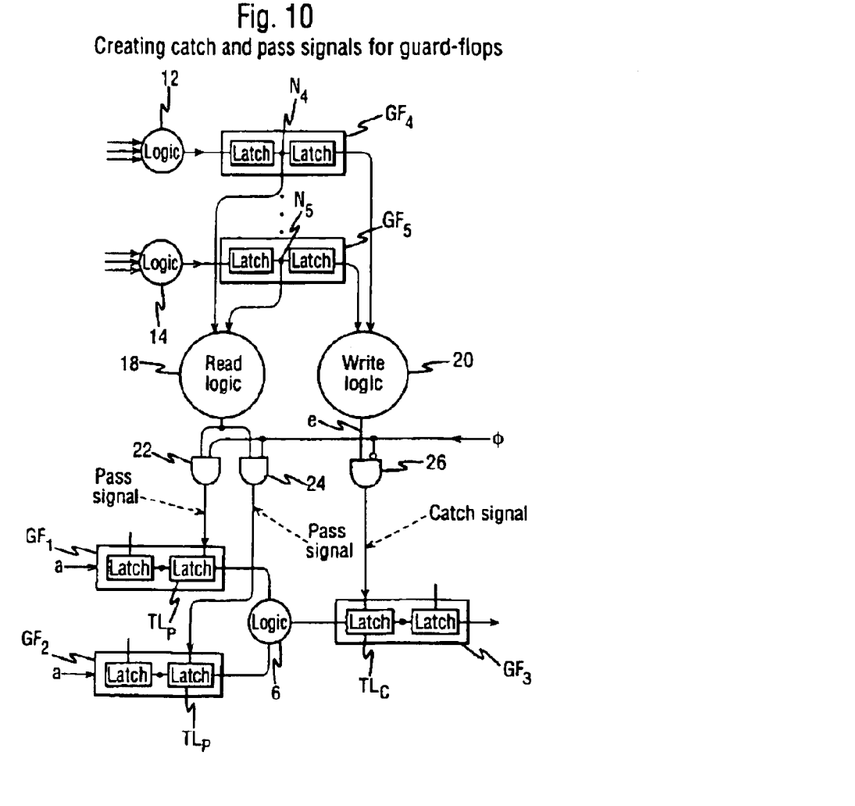
FIG. 10 is a circuit in accordance with one embodiment of the present invention utilising guard-flops and independent control signals for the transparent latches.

Instead of simply enabling a conventional D-type, the corresponding guard-flop in a guard-flop design must be instructed to catch data, and all the guard-flops in the input cone of the first guard-flop must be instructed to pass data. Furthermore, these catch and pass signals need to look like a two-phase clocking scheme, as was shown in FIG. 7, and they need to be glitch-free to avoid spurious activity. The circuit shown in FIG. 10 satisfies these conditions. The lower part of FIG. 10 shows the data handling guard-flops GF$_1$, GF$_2$, GF$_3$ as described above with reference to FIG. 8b. The upper half of FIG. 10 shows a set of control guard-flops GF$_4$, GF$_5$ used for generating the catch and pass signals. Note that although only two control guard-flops GF$_4$, GF$_5$ are illustrated, in fact there could be a plurality of such guard-flops. Each of the control guard-flops has an internal node N$_4$, N$_5$ on which state is stored as described earlier. Inputs to the control guard-flops GF$_4$, GF$_5$ are from logic circuits 12, 14 which are deliberately denoted by the same reference numeral as in FIG. 9, because they constitute the same logic as in the equivalent D-type flip-flop circuit.

FIG. 10 also illustrates the clock $\phi$ used in generation of the pass and catch signals. State from the internal nodes N$_4$, N$_5$ is supplied to Read logic 18, while the outputs of the control guard-flops GF$_4$, GF$_5$ is supplied to Write logic 20. The output of the read logic is supplied to gates 22, 24 which also receive the clock signal $\phi$. These gates generate the pass signals for the transparent pass latches TL$_p$ of the data handling guard-flops GF$_1$, GF$_2$. The output of the write logic 20 is supplied to a gate 26 which also receives an inverted version of the clock $\phi$ and which generates the catch signal for the transparent catch latch TL$_c$ of the output guard-flop GF$_3$.

The Read and Write logic blocks are identical to the Enable logic block in FIG. 9. The Read logic block needs its inputs slightly in advance of the rising clock edge, which is the reason why the internal node N of the guard-flops needs to be used. The conventional way to generate gated versions of the positive clock half-cycle is to use the transparent latch scheme that was shown in FIG. 2. Using the internal node N of the guard-flops eliminates this extra latch, which saves power and area.

FIG. 10 showed how guard-flops can be controlled in a digital circuit, but this does not demonstrate how a circuit using guard-flops can be created. There now follows a description of a set of rules which can be used to translate a conventional circuit using D-type flip-flops into a circuit using guard-flops.

Rule 1

This rule turns D-type flip-flops into single-output guard-flops. It saves no power, and has to satisfy no timing assumptions.

Figure 11:
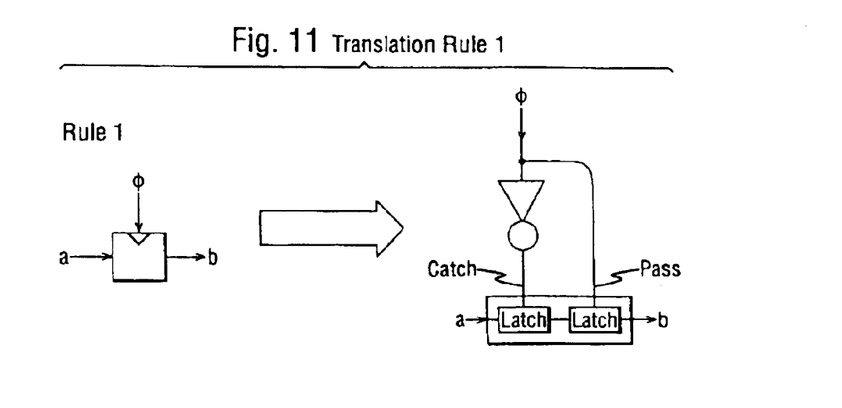
FIG. 11 illustrates the first transformation rule.

The rule is illustrated in FIG. 11 and should be applied to all flip-flops in a design as a first step. That is, according to Rule 1 the data input a of a D-type flip-flop is applied to a transparent catch latch of a guard-flop. The data output b is taken from the output of the transparent pass latch of the guard-flop. The clock signal $\phi$ is supplied as the pass signal to the transparent pass latch and, through an inverter, as the catch signal to the transparent catch latch.

Rule 2

Figure 12:
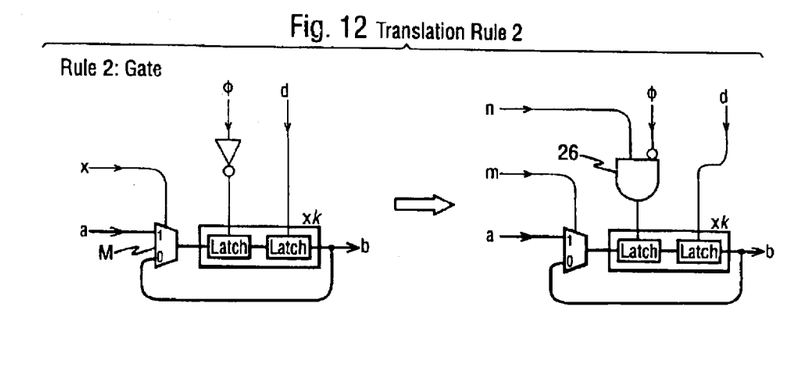
FIGS. 12 and 12a illustrate the second transformation rule.

This rule creates catch expressions for a single guard-flop and is shown in FIG. 12. It is used to gate the clock in situations where the input data to the guard-flop may not always change. The left hand side of FIG. 12 illustrates the transformed guard-flop of FIG. 11, but noting that the pass signal is no longer taken from the clock signal $\phi$, but is provided by an independent signal d. FIG. 12 assumes that the guard-flop has been derived from a D-type flip-flop in the situation of a storage element holding old data as illustrated in FIG. 1. That is, there is a multiplexer M on the input receiving the input data a and the output data b. The multiplexer M is controlled by a control signal x which is derived from logic elsewhere in the circuit and not shown in FIG. 12. It is assumed that x is derived from combinational logic active on a number of inputs and that x can be expressed as a combination of two different signals (n AND m). It will be clear that x is the equivalent of the enable signal. The signal n is derived from the combinational logic which completes within half a clock cycle. If the rule is fully applied, m=1 (that is the multiplexer always passes the input data a), and n=x. As can be seen from FIG. 12, n is applied to the AND gate 26 the other input of which receives an inverted version of the clock $\phi$.

The logic for n will be chosen in an iterative process, starting with m=1 and n=x, and progressively moving terms from n to m until n completes in the time limit.

Figure 12A:
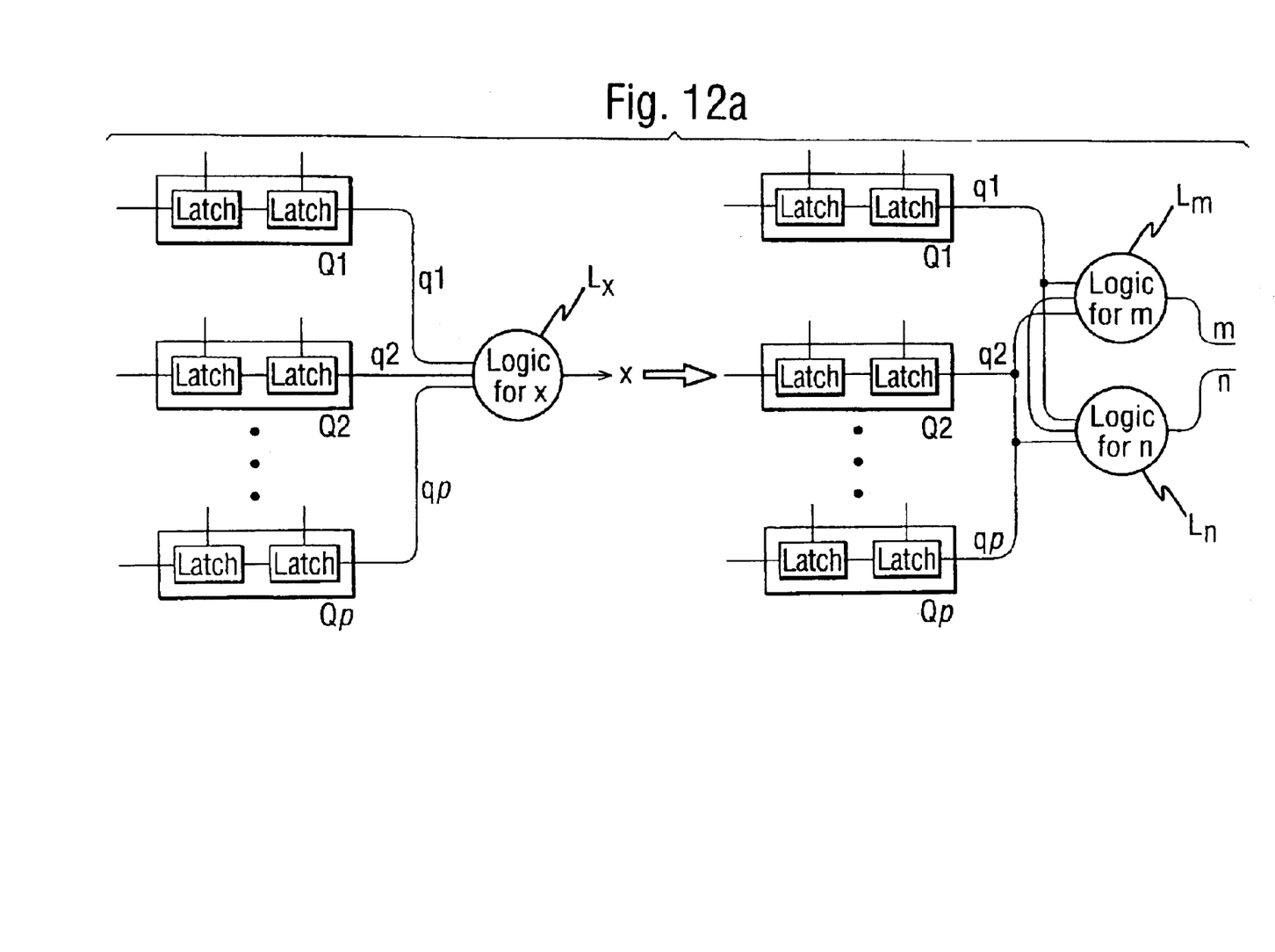

FIG. 12a shows in more detail the relationship between the signal x which acts as the select signal for the multiplexer M prior to transformation according to Rule 2 and the signals n and m. FIG. 12a shows that the signal x is derived from outputs q1, q2 . . . qp from flip-flops Q1, Q2 . . . Qp by the application of logic function L$_x$. When Rule 2 is applied, the logic block L$_x$ is split apart into two logic blocks, L$_m$, L$_n$ for generating the signals m and n respectively. The criteria are that:

1) n completes in half a clock period, and
2) (m AND n)=x.

Criteria 1 means that the logic circuitry L$_n$ from which the signal n is output operates faster than the other logic circuitry, such that the output n can be produced in half a clock cycle. If the above two conditions 1) and 2) are satisfied, then Rule 2 can be used and the results of the translation will be correct. It will be clear that where the logic circuitry L$_x$ is complex, there may be a large number of possible m and n signals for any particular x, and the selection is made based on the timing restriction specified above and the likely power savings to result in each case.

Rule 3

Figure 13A:
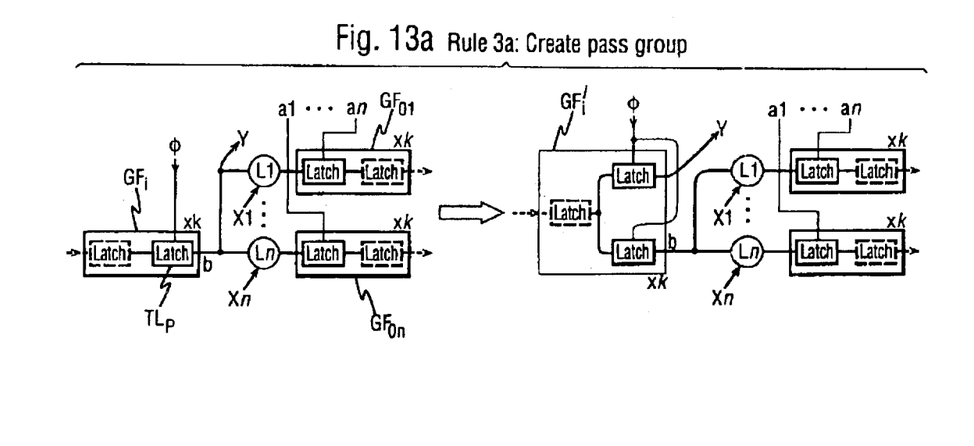
FIGS. 13a, 13b, 13c and 13d illustrate the third transformation rule.

Rule 3 is in effect a number of sub-rules, and implements what is called herein "pass on demand". Rule 3a increases the number of outputs of a guard-flop, and groups together destinations for the output of the guard-flop. Rule 3b creates the pass signal for the guard-flop. Rule 3c generates "early signals". FIG. 13a illustrates Rule 3a. The left hand side of FIG. 13a illustrates an input data handling guard-flop GF$_i$ with the clock signal supplied to the transparent pass latch TL$_p$ labelled $\phi$. Destinations of the data from that particular input guard-flop GF$_i$ are "collected together" in groups. One group consists of the combinational logic circuits $L_1 \ldots L_n$ each of which receive as an input the data b output from the guard-flop $GF_i$ and also each of which has a number of other inputs which are demonstrated diagrammatically by $X_1 \ldots X_n$ in FIG. 13a. The output of each combinational logic circuit $L_1 \ldots L_n$ is supplied to a respective output guard-flop $GF_{O1} \ldots GF_{On}$. Each of those guard-flops has a transparent catch latch receiving a catch signal labelled $a_1, \ldots a_n$. The output b of the input guard-flop $GF_i$ may also be supplied as an input Y to other combinational logic which is not shown. Rule 3a can still be applied in these circumstances. Rule 3a has no timing assumptions.

The right hand side of FIG. 13a shows how the input guard-flop $GF_i$ in the scenario outlined in FIG. 13a is converted to a multiple output guard-flop which is labelled $GF_i'$. This has a single input transparent catch latch and two transparent pass latches. One of these supplies the output b to the combinational logic circuits $L_1 \ldots L_n$, and the other supplies the output b to form the input Y to the other combinational logic circuit which is not shown in the diagram. The signal for each of the transparent pass latches is shown as the clock $\phi$.

Figure 13B:
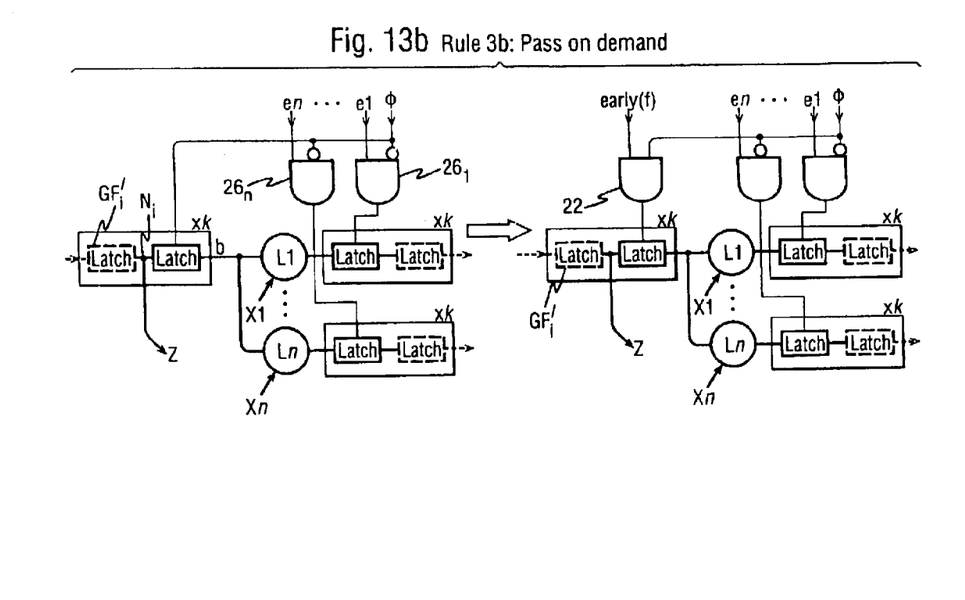

FIG. 13b illustrates Rule 3b. This rule creates the pass signal for the transparent pass latch on the input guard-flop $GF_i'$. Note that in FIG. 13b, only a single transparent pass latch of the multiple output guard-flop of FIG. 13a is illustrated. That is because this rule is applied to each transparent pass latch individually, regardless of the number of pass latches in a particular guard-flop. Z denotes the fact that there are other circuits coming off the internal node $N_i$. Therefore, Z denotes that there may be other output pass latches of that particular guard flop, or indeed other signals which are supplied to other logic circuits.

Figure 13C:
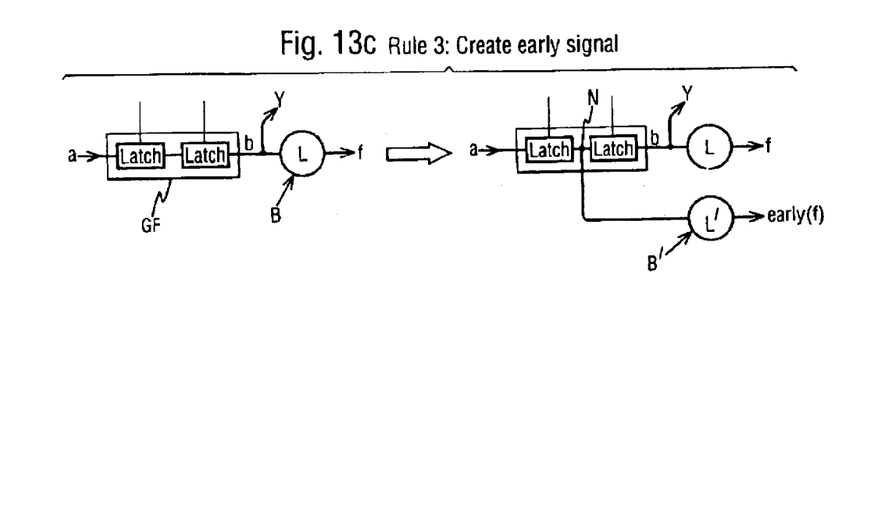
Figure 13D:
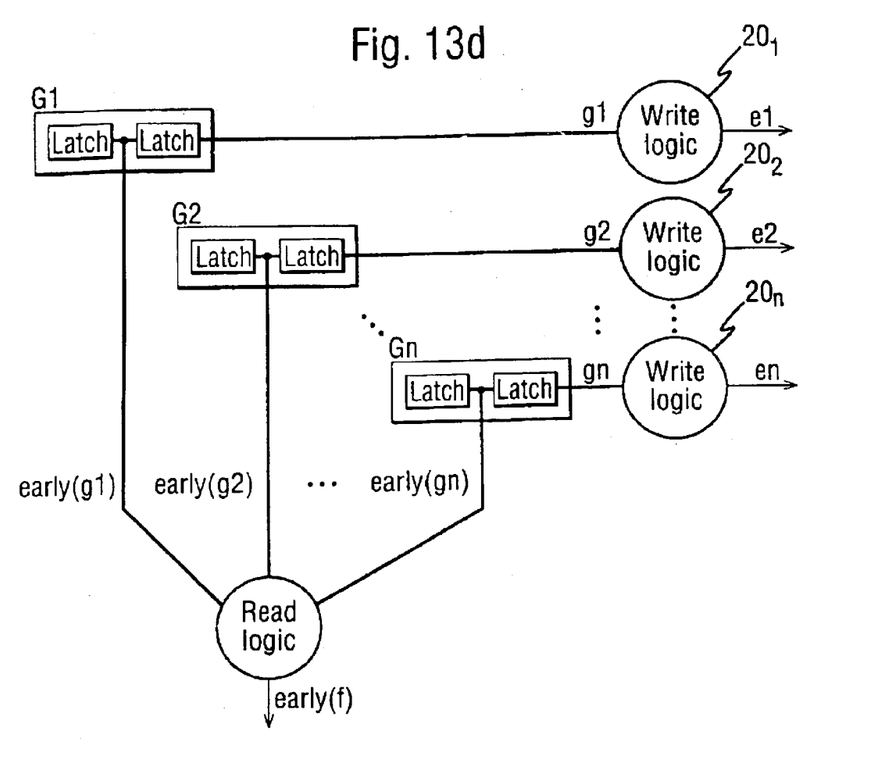

The left hand side of FIG. 13b also shows that the catch signals for the right hand side guard-flops have been generated via gates $26_1 \ldots 26_n$ respectively. Each gate $26_1 \ldots 26_n$ receives the clock signal $\phi$ and a respective enable input $e_1 \ldots e_n$. These enable inputs are derived from respective write logic blocks $20_1 \ldots 20_n$ as shown in FIG. 13d. It will be recalled from FIG. 10 that each write logic block 20 receives the input from one or more control guard-flops and generates an enable signal e for gating the AND gate 26 which generates the catch signal for the transparent catch latch of the output guard-flop ($GF_3$ in FIG. 10). In FIG. 13d, it is made clear that in any particular integrated circuit which is being transformed, there will of course be a plurality of write logic blocks. In FIG. 13d, these are shown as each having an input from a single bank of guard-flops labelled $G_1 \ldots G_n$ in FIG. 13d, but in practice each write logic block $20_1 \ldots 20_n$ could have inputs from any number of input guard-flops.

The right hand side of FIG. 13b illustrates the result of the transformation of the rule implemented in Rule 3b. That is, the pass signal for the transparent pass latch on the input guard-flop $GF_i'$ is generated by supplying the clock $\phi$ to a gate 22, the other input of which receives a so-called "early" signal "early(f)". The generation of an early signal is carried out in accordance with Rule 3c which is illustrated in FIG. 13c. FIG. 13c shows a guard-flop GF the output b of which is connected to combinational logic which generates a signal f depending on the state of b and any other signals input to the combinational logic which are denoted B in FIG. 13c. In FIG. 13c, Y denotes other circuit elements that are connected to the output of the guard-flop GF. According to Rule 3c, an early signal, early(f), is created by taking the state of the node N and applying that as an input to the combinational logic L' which is the same as the combinational logic L connected to the output b of the guard-flop. Other inputs B' may also be connected to the combinational logic L' generating the early(f) signal, assuming that B' is constituted by the "early" version of the signals B supplied to the combinational logic L. That is, these other inputs can themselves be derived from the internal nodes of other guard-flops as illustrated in FIG. 10. That is, in FIG. 10, the signal on internal nodes $N_4$ and $N_5$ is applied to the read logic 18 and the output of this generates an early signal which is supplied to the inputs of the AND gates 22, 24. The outputs of these AND gates 22, 24 supply the pass signal for the transparent pass latches of the guard-flops.

Referring to FIG. 13d, the outputs of each of the guard-flops $G_1 \ldots G_n$ are labelled $g_1 \ldots g_n$. The early versions of these signals, derived from the internal nodes of the respective guard-flops are labelled early($g_1$) ... early($g_n$). These early signals are supplied to the read logic 18 which generates the early(f) signal which is then used to gate the transparent pass latch on the input guard-flop as shown in FIG. 13b.

Rule 3b has a timing assumption on early(f). The early(f) signal must be available one AND gate delay before the rising edge of the clock. With reference to Rule 3c the delay through the logic to produce early(f) from its early-tapped inputs, plus the delay to produce those inputs from their inputs, plus the AND gate delay, must all be less than one clock period. If this restriction cannot be satisfied, the rule can be partially applied: terms must be left out of the expression for f, making sure it still satisfies (e1 OR e2 OR ... en)$\Rightarrow$f, where (A$\Rightarrow$B) means (NOT (A) OR B).

Figure 14A:
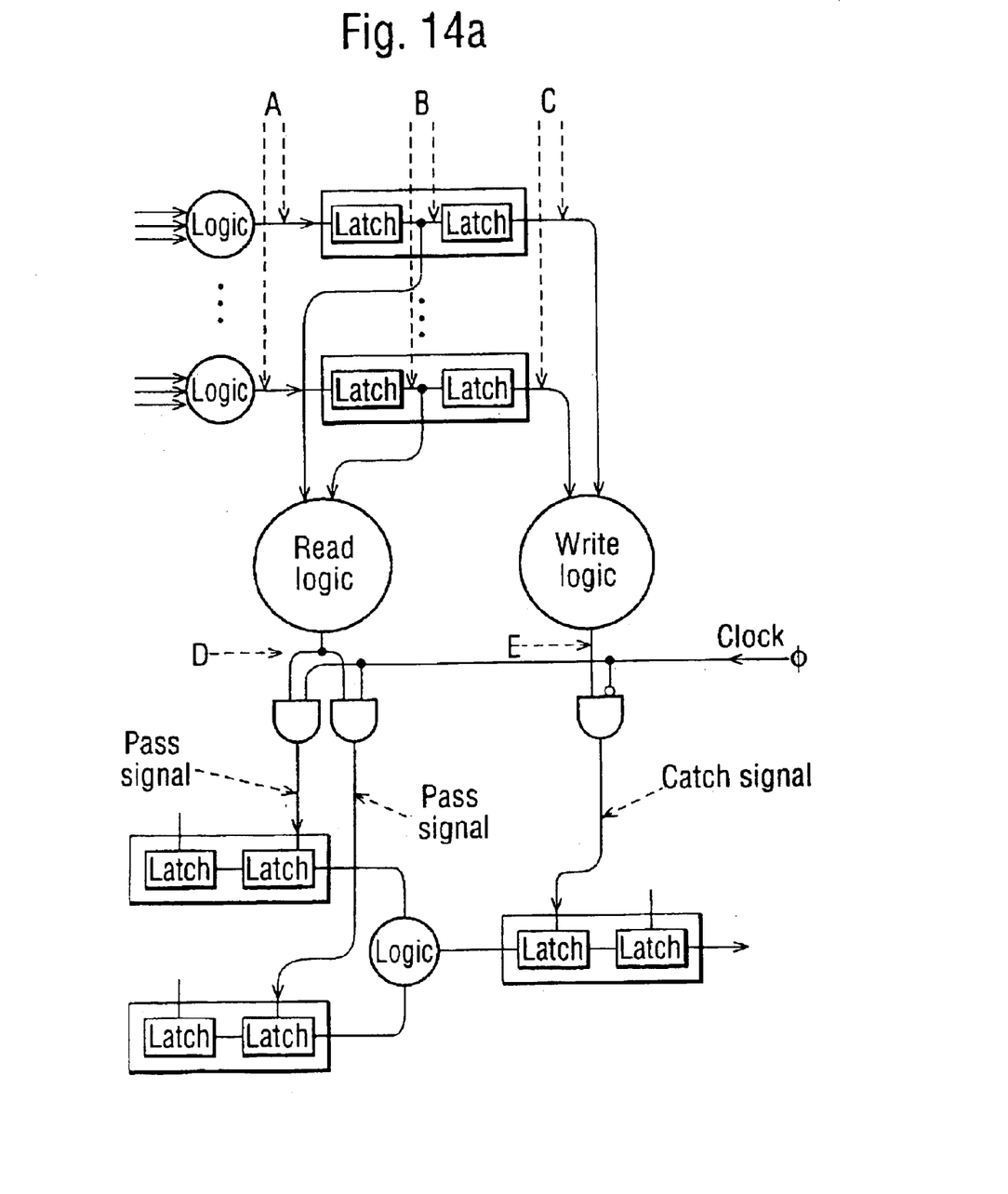
FIG. 14a is a circuit diagram illustrating timing nodes.
Figure 14B:
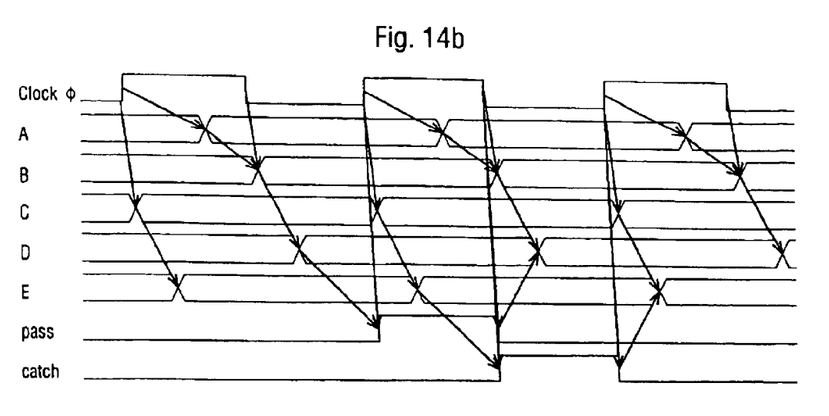

FIGS. 14a and 14b illustrate the timing of the circuit. FIG. 14a illustrates the circuit of FIG. 10, with nodes A to E and the catch and pass signals being marked using dotted lines. FIG. 14b denotes the timing at these nodes relative to the clock $\phi$, and can be used to determine the timing assumptions that need to be satisfied for the guard-flop circuit to work. The pass signal will occur shortly after the rising edge on $\phi$, so the data must have arrived on D just before the clock edge. FIG. 14b shows that the data on D depends on the data at point B, and that the data at point B changes one latch delay after the calling edge on $\phi$. Together, these imply that the delay of the Read logic in FIG. 14a, plus the delay of a transparent latch, must be less than half a clock period.

The data on B also depends on the data on A, and the data on A changes some time after the rising clock edge, according to the delay of the logic creating A. By following the arrows from $\phi$, through A, B and D to the pass signal in FIG. 14b, it can be seen that the delay of the logic creating A, plus a transparent latch delay, plus the delay of the read logic, must all be less than a clock period.

The catch signal is derived from the data at point E, which is in turn produced from the data at point C, which is valid one latch delay after the rising edge of $\phi$.

The catch signal is created as $\phi$ falls, so there is only half a clock period between the rising edge on $\phi$ and the catch signal being needed. Hence the delay through the write logic plus one latch delay must be less than half a clock period.

Figure 15:
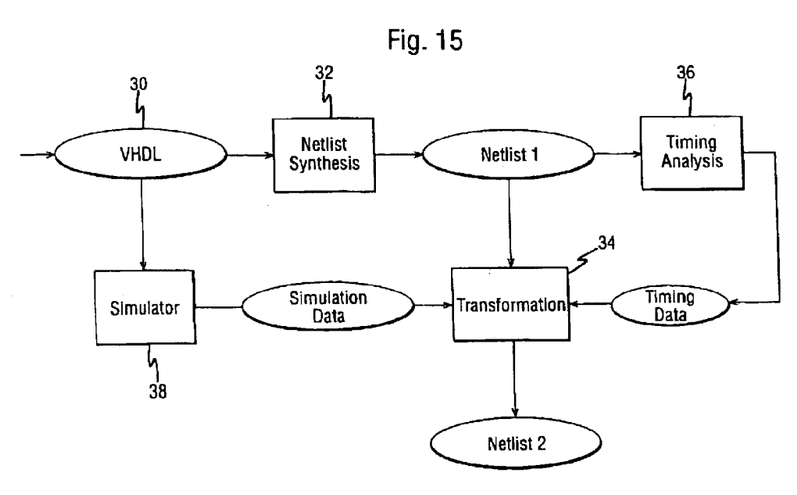
FIG. 15 is a schematic block diagram of a computer environment implementing the transformation rules.

FIG. 15 is a schematic diagram illustrating how the rules are applied in a computer environment. In order to manufacture a silicon circuit, it is usual for a software version of the circuit to be created for simulation and other purposes. In FIG. 15 this is denoted as VHDL 30, although any other HDL could be used. The VHDL version is supplied to a netlist synthesis block 32 which generates a netlist labelled NETLIST1 in FIG. 15. This netlist is subject to the rules in the transformation block 34, and a transformed netlist labelled NETLIST2 in FIG. 15 is provided as the result of using the rules. The transformation block 34 can be implemented as any suitably programmed computer. The program includes algorithms implementing the rules as described above.

In order to apply the rules, timing data is normally needed and this can be provided by carrying out a timing analysis 36 on the first netlist NETLIST1, and applying the resulting timing data to the transformation block 34. To enhance application of the rules, simulation data can be provided from a simulator 38 acting on the original VHDL.

It is a particular advantage of the rules described above that the transformation block 34 can be implemented as automated software tools to produce a guard-flop circuit from a circuit using D-type flip-flops without requiring any knowledge on the part of the designer. Thus, the fact that guard-flops have been used to implement the circuit is almost entirely hidden from the circuit designer. This allows the designer to apply his knowledge of D-type flip-flops to create a circuit, and then for the circuit to be converted into a low power version using guard-flops without him having to know and understand guard-flop design styles.

A particular advantage of the rules described above as compared to conventional approaches such as guarding and clock gating is that they can be partially applied. Rule 2 and Rule 3b allow partial clock gating and partial guarding respectively. An all-or-nothing approach often leads to power saving opportunities being wasted, because the all-out solution was too costly. A partial solution can achieve some power benefits without incurring an unacceptable cost.

Moreover, the rules are designed to keep the behaviour of the circuit constant. Rule 1 is a preliminary rule and should be used first. Rule 2 should be applied in all cases that it can be before moving on to Rule 3. Rules 3a and 3b need to be done together, whereas Rule 3c is an enabling rule which serves to define notation. As noted above, some of the rules have timing assumptions which must be checked, for example by a static timing analyser.

What is claimed is:

1. A latch circuit comprising:
    a transparent catch latch having a data input, a data output and a control node arranged to receive a catch signal;
    a transparent pass latch having a data input connected to the data output of the transparent catch latch at an internal storage node, a data output, and a control node arranged to receive a pass signal; and
    logic circuitry having an enable input and a clock input connected to provide a gated clock signal to provide one of said catch signal and said pass signal.

2. A latch circuit according to claim 1, wherein the gated clock signal provides said catch signal.

3. A latch circuit according to claim 2, which comprises a multiplexer having an output connected to the data input of the transparent catch latch, a first input connected to receive a data signal, a second input connected to the data output of the transparent pass latch and a control input for receiving a control signal for determining whether the multiplexer is active or not.

4. A latch circuit according to claim 3, wherein the control signal for the multiplexer and an enable signal provided to the enable input of the logic circuitry cooperatively control the latch circuit.

5. A latch circuit according to claim 1, wherein the gated clock signal provides said pass signal.

6. A latch circuit according to any preceding claim, which comprises combinational logic connected to said internal storage node and active to generate an early signal usable as an enable signal for a similar latch circuit.

7. An integrated circuit comprising an input guard-flop, combinational logic and an output guard-flop, wherein each guard-flop comprises a transparent catch latch connected to a data input and arranged to hold data on an internal storage node of the guard-flop, a transparent pass latch connected to the internal storage node and arranged to pass data to a data output node, and wherein the data output node of the input guard-flop is connected to the input of the combinational logic and the data input node of the output guard-flop is connected to the output of the combinational logic, the integrated circuit further comprising a logic gate having an enable input and a clock input connected to provide a gated clock signal to at least one of the transparent pass latch of the input guard-flop and the transparent catch latch of the output guard-flop.

8. An integrated circuit according to claim 7, which comprises a further logic gate having an enable input and a clock input connected to provide a further gated clock signal to the other one of said transparent pass latch of the input guard-flop and the transparent catch latch of the output guard-flop.

9. An integrated circuit according to claim 7 or 8, which comprises a plurality of input guard-flops, the data outputs of which are connected to the combinational logic.

10. An integrated circuit according to claim 9, wherein there is a respective logic gate associated with the transparent catch latch of each input guard-flop for providing a gated clock signal thereto.

11. An integrated circuit according to claim 7 or 8, which comprises a plurality of combinational logic blocks, each connected to the data output of the input guard-flop and each providing a signal to the data input of a respective one of a plurality of output guard-flops.

12. An integrated circuit according to claim 11, wherein the transparent catch latches of each of the output guard-flops is associated with a respective logic gate providing a respective gated clock signal thereto, responsive to respective enable signals.

13. An integrated circuit according to claim 12, wherein an enable signal for supplying to the enable input of the logic gate associated with the input guard-flop is derived from at least some of early versions of said enable signals for the output guard-flops.

* * * * *